(12) United States Patent
Stopka et al.

(10) Patent No.: US 12,106,933 B2
(45) Date of Patent: Oct. 1, 2024

(54) METHOD TO CORRECT FIRST ORDER ASTIGMATISM AND FIRST ORDER DISTORTION IN MULTI-BEAM SCANNING ELECTRON MICROSCOPES

(71) Applicant: FEI Company, Hillsboro, OR (US)

(72) Inventors: Jan Stopka, Brno (CZ); Bohuslav Sed'a, Brno (CZ)

(73) Assignee: FEI Company, Hillsboro, OR (US)

( * ) Notice: Subject to any disclaimer, the term of this patent is extended or adjusted under 35 U.S.C. 154(b) by 115 days.

(21) Appl. No.: 17/694,549

(22) Filed: Mar. 14, 2022

(65) Prior Publication Data

US 2022/0328284 A1 Oct. 13, 2022

Related U.S. Application Data

(60) Provisional application No. 63/169,060, filed on Mar. 31, 2021, provisional application No. 63/169,064, filed on Mar. 31, 2021.

(51) Int. Cl.
*H01J 37/28* (2006.01)
*H01J 37/10* (2006.01)
*H01J 37/153* (2006.01)

(52) U.S. Cl.
CPC ............. *H01J 37/28* (2013.01); *H01J 37/10* (2013.01); *H01J 37/153* (2013.01); *H01J 2237/0453* (2013.01); *H01J 2237/1532* (2013.01)

(58) Field of Classification Search
CPC .. H01J 37/00; H01J 37/02; H01J 37/26; H01J 37/28; H01J 37/10; H01J 37/153; H01J 37/261; H01J 2237/0453; H01J 2237/1532

USPC ............... 250/306, 307, 311, 396 R
See application file for complete search history.

(56) References Cited

U.S. PATENT DOCUMENTS

| | | | |
|---|---|---|---|
| 6,630,681 B1 | 10/2003 | Kojima | |
| 2005/0006601 A1 | 1/2005 | Muraki et al. | |
| 2010/0148087 A1* | 6/2010 | Doering | B82Y 40/00 250/396 R |
| 2013/0062520 A1* | 3/2013 | Henstra | H01J 37/153 250/397 |
| 2016/0358745 A1* | 12/2016 | Katou | H01J 37/222 |
| 2017/0154756 A1* | 6/2017 | Ren | H01J 37/141 |
| 2019/0341222 A1* | 11/2019 | Hu | H01J 37/3177 |

OTHER PUBLICATIONS

EP22163969.3, Extended European Search Report, Jan. 5, 2023, 15 pages.

* cited by examiner

*Primary Examiner* — Jason L McCormack
(74) *Attorney, Agent, or Firm* — Michael Best & Friedrich LLP

(57) ABSTRACT

An example multi-beam scanning electron microscope (MB-SEM) for correcting both astigmatism and linear distortion at least includes an electron source coupled to provide an electron beam, an aperture plate comprising an array of apertures, the aperture plate arranged to form an array of electron beamlets from the electron beam, and an electron column including a plurality of lenses and first and second stigmators, the electron column coupled to direct the array of electron beamlets toward a sample, wherein the first and second stigmators are arranged and excited to correct both astigmatism and linear distortion.

14 Claims, 6 Drawing Sheets

METHOD TO CORRECT FIRST ORDER ASTIGMATISM AND FIRST ORDER DISTORTION IN MULTI-BEAM SCANNING ELECTRON MICROSCOPES

PRIORITY BASIS

This application claims priority from U.S. Provisional Application No. 63/169,064 filed Mar. 31, 2021 and U.S. Provisional Application No. 63/169,060 filed Mar. 31, 2021, both of which are hereby incorporated by reference.

FIELD OF THE INVENTION

The invention relates generally to multi-beam charged particle microscopes, and specifically to multi-beam charged particle microscopes that include multiple stigmators for correcting astigmatism and first order distortion.

BACKGROUND OF THE INVENTION

Charged particle microscopes can suffer from various image quality issues, many of which result from column misalignments. Such image quality issues can result in astigmatism and distortions, for example. The astigmatism results in focus varying along orthogonal directions, while the distortions can result in skew or variation in magnification along orthogonal directions in the field of view. While first order distortions present in single charged particle beam microscopes is typically of little concern, first order distortions in multi-beam microscopes can distort individual images of an array of images, which affects overall image quality and throughput for stitching together the individual images. Although a stigmator arranged in a charged particle microscope can adjust astigmatism or first order distortion, it is difficult to sufficiently correct both, especially in a multi-beam charged particle microscope. As microscope throughput increases are desired, solutions for correcting both astigmatism and first order distortions is desired.

SUMMARY

One example multi-beam scanning electron microscope (MB-SEM) for correcting both astigmatism and linear distortion at least includes an electron source coupled to provide an electron beam, an aperture plate comprising an array of apertures, the aperture plate arranged to form an array of electron beamlets from the electron beam, and an electron column including a plurality of lenses and first and second stigmators, the electron column coupled to direct the array of electron beamlets toward a sample, wherein the first and second stigmators are arranged and excited to correct both astigmatism and linear distortion.

Another example multi-beam scanning electron microscope (MB-SEM) for correcting both astigmatism and linear distortion at least includes an electron source coupled to provide an electron beam, an aperture plate comprising an array of apertures, the aperture plate arranged to form an array of electron beamlets from the electron beam, a plurality of lenses, first and second stigmators, and an electron column including the plurality of lenses and the first and second stigmators. The electron column coupled to direct the array of electron beamlets toward a sample, wherein the column, due to the plurality of lenses, forms at least one individual beam crossover plane in which each of said electron beams forms an intermediate image of said electron source, and at least one single common beam crossover plane in which the electron beams in the array cross each other, where an odd number of crossover planes, counting both individual and common beam crossover planes, are between the first and second stigmators.

And yet another example multi-beam scanning electron microscope (MB-SEM) for correcting both astigmatism and linear distortion at least includes a source coupled to provide an electron beam, an aperture array plate arranged to provide a plurality of probe beams from the electron beam, first and second stigmators, and a controller coupled to at least control an excitation of the first and second stigmators. The controller including code that, when executed by the controller, causes the controller to determine an anamorphic strength of two stigmators, determine an astigmatic strength of the two stigmators, based on the anamorphic and astigmatic strengths, determine at least two linear combinations of excitations for the two stigmators to affect astigmatism and linear distortion, and excite the first and second stigmators, based on the two linear combinations, to adjust astigmatism and linear distortion.

An example method for exciting a plurality of stigmators for correcting astigmatism and first order distortion in a multi-beam scanning electron microscope at least includes determining an anamorphic strength of two stigmators, determining an astigmatic strength of the two stigmators, based on the anamorphic and astigmatic strengths of the two stigmators, determining at least two linear combinations of excitations for the two stigmators to affect astigmatism and linear distortion, and exciting the two stigmators, based on the two linear combinations, to adjust astigmatism and linear distortion.

Another example of a multi-beam scanning electron microscope (MB-SEM) at least includes a source coupled to provide an electron beam, an aperture array plate arranged to provide a plurality of probe beams from the electron beam, first and second stigmators, and a controller coupled to at least control an excitation of the first and second stigmators. The controller including code that, when executed by the controller, causes the controller to determine an anamorphic strength of two stigmators, determine an astigmatic strength of the two stigmators, based on the anamorphic and astigmatic strengths, determine at least two linear combinations of excitations for the two stigmators to affect astigmatism and linear distortion, and excite the first and second stigmators, based on the two linear combinations, to adjust astigmatism and linear distortion.

BRIEF DESCRIPTION OF THE DRAWINGS

Like reference numerals refer to corresponding parts throughout the several views of the drawings.

DETAILED DESCRIPTION OF EMBODIMENTS

Figure 1A:
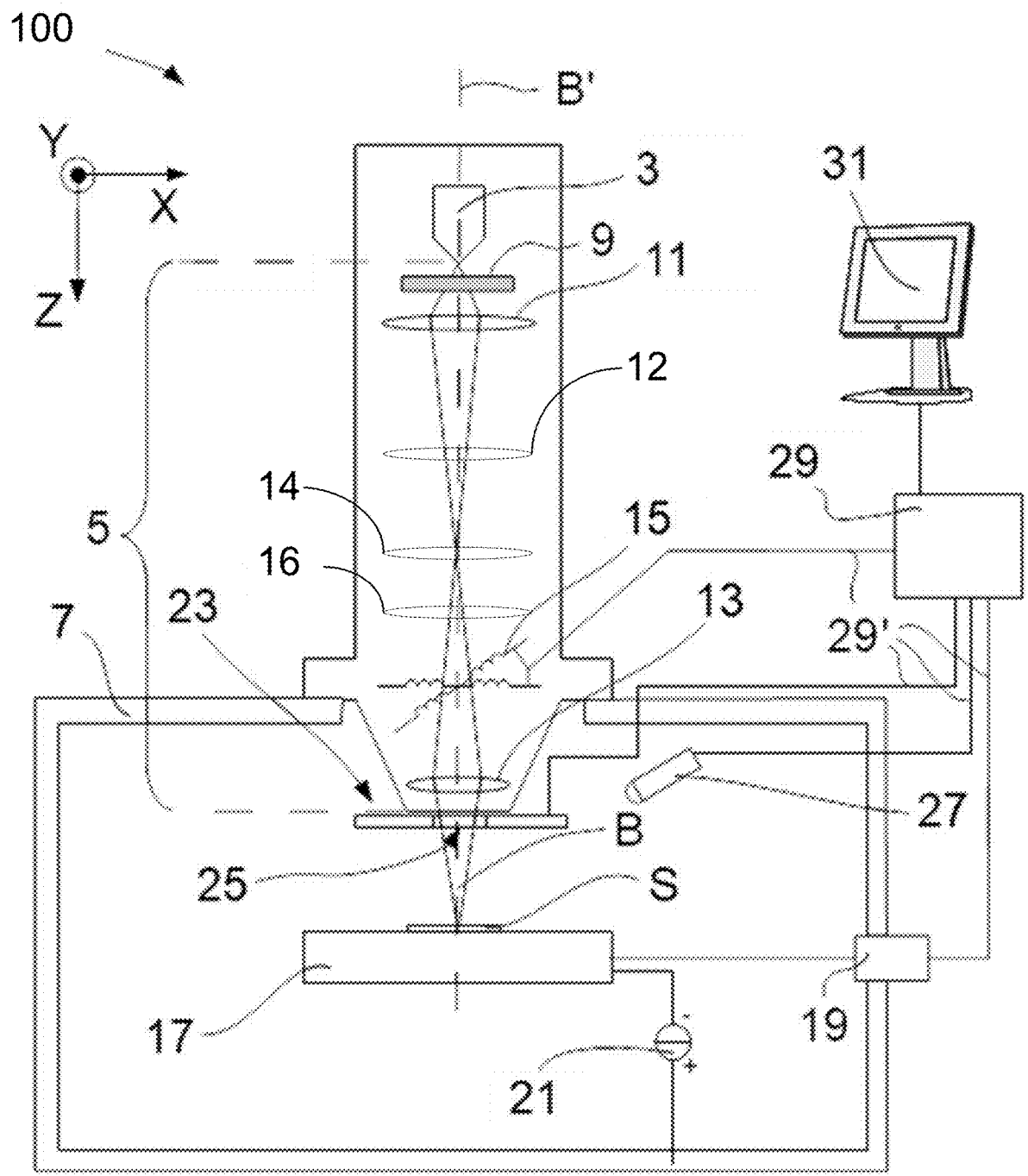
FIG. 1A is a schematic depiction of a multi-beam charged particle microscope in accordance with an embodiment of the present disclosure.

Embodiments disclosed herein a directed toward a charged particle beam column designed for multi-beam operation, where the column includes at least two stigmators positioned and energized to correct for both astigmatism and linear distortion. In some examples, two stigmators are arranged within the column so that they can be operated substantially independent from one another, meaning that one can be operated to mainly control for astigmatism, whereas the other one is operated to mainly control for linear distortion. It should be noted, however, that full independence is not achievable since astigmatism and linear distortion are physical phenomena that are inherently linked. In some examples, the stigmators are placed such that there are an odd number of crossovers occurring between their locations. While the two stigmators may operate substantially independent even with an even number of crossovers occurring between their locations, the odd number of crossovers ensures greater independent operation. Additionally, the embodiments disclosed herein are directed toward a method of determining the excitation that each stigmator should be provided so that both astigmatism and linear distortion are corrected. It should be understood that the methods described herein are generally applicable to a wide range of different methods and apparatus, and are not limited to any particular apparatus.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatuses are referred to as "lowest", "best", "minimum," or the like. It will be appreciated that such descriptions are intended to indicate that a selection among many used functional alternatives can be made, and such selections need not be better, smaller, or otherwise preferable to other selections.

Multi-beam charged particle microscopes, such as multi-beam scanning electron microscopes (MB-SEMs) which use a plurality of charged particle beamlets, provide the ability to image large areas of a sample simultaneously due to forming the plurality of beamlets into an array of beamlets. Each beamlet will generate a respective image of a small area of the sample, and the individual images may be stitched together to provide a composite image of the sample. While this technique can enhance throughput of image acquisition, issues may arise when stitching together the various individual images. Such issues may be due to distortions, such as skew, stretching and/or anisotropic magnification. The distortion, due to the stretching for example, may result in higher cross-talk on the detector, and may also require large over-scanning of each beamlet's respective sample area. The cross-talk issue limits resolution and contrast, whereas the over-scanning may limit throughput.

One technique to reduce or eliminate the distortions, and reduce over-scanning requirements, is to add one or more additional stigmators to a multi-beam charged particle column. Such additional stigmator(s) may provide flexibility to not only correct for astigmatism, but to also correct for first order distortion. Such first order distortion may be referred to herein as anamorphosis, linear distortion, or elliptical distortion. The first order distortion results in different magnification in orthogonal directions, such as x and y directions in the plane of the sample, which may also manifest as skew in the individual beamlet-based images. The correction of the first order distortion may result in a reduction in an amount of over-scan needed for each beamlet, and improve signal quality on the detector, which improves image quality. Although astigmatism and linear distortion are linked, they can be substantially independently corrected if respective stigmators are arranged in a charged particle column in a manner that reduces their interrelation. For example, a first stigmator may be arranged adjacent to or coincident with a common beam crossover plane, while a second stigmator is arranged adjacent to or downstream from a beamlet crossover plane. For clarity, a common crossover plane is a plane in the charged particle column where all beamlets crossover each other, whereas a beamlet crossover plane is a plane in the column where each beamlet crosses over only itself. In general, it is desirable to arrange the two stigmators so that an odd number of crossovers occur between their locations, where the odd number of crossovers count both common and individual, or beamlet, crossovers. Such arrangement will result in the substantial operational independence of the two stigmators such that astigmatism and linear distortion can be corrected substantially independently of one another. Although it is not possible to affect the linear distortion without simultaneously changing the astigmatism, the arrangement may result in one stigmator being more dedicated to correcting linear distortion than astigmatism correction. However, that stigmator will also inevitably influence the astigmatism. It should be noted that any arrangement of the two stigmators within the column is within the bounds of the disclosure, both even and odd numbers of crossovers occurring between the two stigmators.

In general, the two stigmators of the disclosed techniques may have a different effect on astigmatism and linear distortion. If we let $A_{tot}$ and $D_{tot}$ be the required astigmatism and distortion created by the stigmators a and b, $e_a$ an $e_b$ be the excitation of the stigmators a and b, $A_1$ and $A_2$ be the astigmatism sensitivity constants for the stigmators a and b, and $D_1$ and $D_2$ be the distortion sensitivity constants for the stigmators a and b, then the following relationships can be formed:

$$A_a = e_a A_1$$

$$A_b = e_b A_2$$

$$D_a = e_a D_1$$

$$D_b = e_b D_2$$

$$A_{tot} = e_a A_1 + e_b A_2$$

$$D_{tot} = e_a D_1 + e_b D_2$$

The last two provide two equations with two unknowns in terms of the excitations, which can be solved under certain conditions, such as:

$$\frac{D_2}{D_1} \neq \frac{A_2}{A_1},$$

$A_1$ and $A_2$ should not both be zero, $D_1$ and $D_2$ should not both be zero. It should be noted that $A_{tot}$ and $D_{tot}$ are interrelated due to each equation including excitations of both stigmators a and b. Although this interrelation may make controlling the stigmators to correct for both astigmatism and linear distortion more difficult, there may be positions in an MB-SEM column where the two stigmators can be located that may reduce the interrelation and ease their operation.

In general, the two stigmators may be located most anywhere along the optical path of the column between the emitter and sample, as long as they are sufficiently separated. Sufficient separation is established based on the relative locations of the two stigmators with respect to the two types of crossovers occurring in the column. In some examples, however, it may be desirable to avoid locating a stigmator in a same plane as the individual crossovers or locating both stigmators on opposite sides of the individual crossover plane due to the lack of affect the stigmators may have in and around this plane. On the other hand, locating a stigmator in a plane with a common crossover may provide astigmatism correction without affecting linear distortion. Further, locating a stigmator between a common crossover plane and an individual crossover plane may allow for that stigmator to effect linear distortion more than astigmatism. In some examples, arranging one stigmator at a common crossover plane and arranging the other stigmator between an individual crossover plane and a subsequent common crossover plane may allow these two stigmators to be substantially independently operated such that one mainly affects astigmatism, while the other affects linear distortion more than astigmatism. See FIG. 3 below for additional detail.

The disclosed techniques additionally determine the excitation to be applied to each stigmator so that both astigmatism and linear distortion are corrected, e.g., reduced or eliminated. The techniques include determining the astigmatic strength and anamorphic strength of each stigmator per unit of excitation, determining combinations of excitation of the two stigmators to address both linear distortion and astigmatism, then applying one or more excitations to the stigmators. As used herein, anamorphic strength refers to the degree of linear distortion correction per unit of excitation a stigmators can provide to the electron beam and/or beamlets. The concept of anamorphic strength may also be referred to herein as linear distortion correction capability per unit of excitation. It should be noted that the relative positions of the stigmators within the microscope affects the excitation of each stigmator.

FIG. 1A is a schematic depiction of a multi-beam charged particle microscope 100 in accordance with an embodiment of the present disclosure. Multi-beam charged particle microscope (MBCPM) 100 shows an embodiment of an SEM, but microscope 100 could also be a STEM or a lithographic imaging system, for example. The microscope 100 includes, inter alia, an electron source 3, an electron beam column 5, a vacuum chamber 7, an aperture plate 9, stage 17, and detectors 23 and 27. The microscope 100 provides a plurality of charged particle beamlets to a sample S and acquires an image for each of the beamlets. To reduce or eliminate astigmatism and first order distortion (e.g., linear distortion), microscope 100 includes at least two stigmators arranged such that their performance is substantially independent. Reducing or eliminating at least linear distortion will at least allow for increased throughput and improved image quality.

Emitter 3 may be any electron emitter, such as a Schottky emitter, cold FEG or LaB6 filament, for example, that produces an electron beam B. The electron beam B may propagate along a particle-optical axis B'.

Electron beam column 5 may include a plurality of lenses, an aperture array plate 9 and a plurality of stigmators. The plurality of lenses may at least include lenses 11, 13 and 14, which may direct/focus the electron beam B toward a sample plane. A deflection unit 15 arranged within column 5 may deflect and/or scan beam B. In some examples, column 5 may also comprise aberration correctors, field stops, etc.

The aperture array plate 9 may be located between the emitter 3 and lens 11, and may include an array of apertures, which may be in a grid of n×n apertures. Of course, other aperture configurations, such as linear or circular, are also possible. The number of apertures can be any desired number and is a non-limiting aspect to the present disclosure. In some examples the aperture array plate 9 includes an array of 8×8 apertures, which can produce 64 beamlets from electron beam B.

The plurality of stigmators, such as stigmators 12 and 16, may be arranged within the column 5 to correct for both astigmatism and linear distortions according to their respective excitations. If the stigmators are arranged as disclosed herein, the combination of the stigmators 12, 16 may be excited so that both astigmatism and linear distortion are corrected nearly independent of one another. In some examples and depending on the relative arrangement of the two stigmators 12 and 16, each stigmator may substantially adjust linear distortion or astigmatism independently. Further, whether a stigmator corrects for astigmatism or linear distortion may depend on a type of crossover the stigmator is coincident with or adjacent to. For example, if a stigmator is adjacent to or coincident with a common beam crossover, then that stigmator is arranged to mainly correct astigmatism. On the other hand and with the other stigmator located at a common crossover location, if the stigmator is arranged in between an individual beam crossover and a common beam crossover, then that stigmator is arranged to mainly correct linear distortion. While linear distortion and astigmatism are linked, the correction of each can be substantially de-linked if the stigmator placements within the column is such that they can be operated substantially independent of one another. This independence can be obtained by physically arranging them such that at least one beam crossover occurs between their respective locations. In some examples, the stigmators are arranged so that an odd number of crossovers, counting both common and individual crossovers, occurs between their locations. While there may also be an even number of intervening crossovers occurring between the two stigmators in some examples, an odd number may improve the independent operation of the two stigmators. It should be noted that the order in which they are placed does not affect the correction of both astigmatism and linear distortion. It is their relative location to each other and to the crossovers that determine their independence and their relative effect.

Figure 1B:
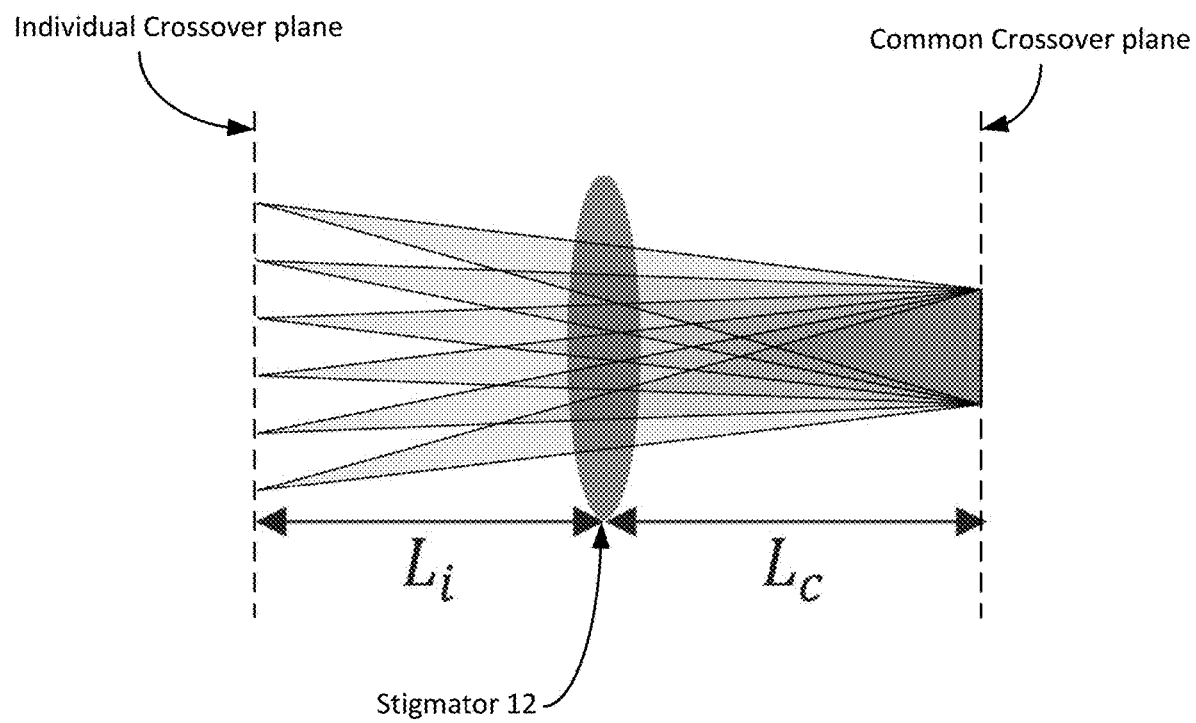
FIG. 1B is an example illustration of a stigmator located with respect to common and individual crossover planes and will be used to illustrate the effect of a stigmators with respect to astigmatism and linear distortion in accordance with an embodiment of the present disclosure.

FIG. 1B is an example illustration of a stigmator located with respect to common and individual crossover planes and will be used to illustrate the effect of a stigmator with respect to astigmatism and linear distortion. FIG. 1B shows stigmator 12 positioned between a common crossover plane and an individual crossover plane with respective distances $L_c$ and $L_i$. The distances $L_c$ and $L_i$ determine the effect stigmator 12 has on astigmatism and linear distortion, e.g., anamorphosis. The strength of stigmator 12 with respect to astigmatism, e.g., effect on astigmatism by stigmators 12, is approximately proportional to $L_i^2$, whereas the strength with respect to linear distortion, e.g., effect on, is proportional to $L_i*L_c$. It should be noted that these distances are directional and referenced to the plane of the stigmator, which results in both positive and negative values.

To correct for both linear distortion and astigmatism, it is desirable that both stigmators 12 and 16 are strong with respect to astigmatism and that at least one of the stigmators 12 or 16 is sufficiently strong with respect to linear distortion. To be strong with respect to astigmatism, for example, positioning the stigmator sufficiently far away from the individual crossover plane is desired, whereas to be strong with respect to linear distortion positioning the stigmator sufficiently far away from the common crossover plane is desired. It is also desirable that each stigmator is positioned such that they are sufficiently independent of each other. Positioning the stigmators so they are sufficiently independent of each other may simplify their operation but is not a requirement of the disclosed technique. As such, it is desirable to have the pair of values ($L_i^2$, $L_i*L_c$) for stigmator 12 as orthogonal as possible with the pair of values ($L_i^2$, $L_i*L_c$) for stigmator 16. In general, it is desirable to locate the two stigmators so that they operate substantially independent of one another and that both astigmatism and linear distortion can be corrected.

It should also be noted that locating a stigmator in the same plane as the individual crossovers may not affect either linear distortion nor astigmatism, whereas locating a stigmator in the same plane as a common crossover may not distort the image but does affect astigmatism. Accordingly, it may be operationally beneficial to locate a stigmator at a common crossover to affect astigmatism without affecting linear distortion, but such arrangement is not required.

Given the above constraints, there may be a variety of positions stigmators 12 and 16 may be located in column 5 to provide the disclosed advantages with regards to correcting both astigmatism and linear distortion. Although, some locations may be more easily implementable in terms of column design and engineering than others. Additionally, there may be arrangements that provide more decoupling of the operation of the two stigmators than others. It should be noted, however, that such an arrangement is not necessary for the implementation of the techniques disclosed herein, and all configurations are contemplated herein. The various locations of the stigmators will be discussed in more detail below with regards to FIG. 3, and the locations of stigmators 12 and 16 in FIG. 1 are for illustration purposes only. It should further be noted that the location of the stigmators 12 and 16 may affect their operation as well since changes in location of one or both stigmators change how much each affects both astigmatism and linear distortion.

A vacuum chamber 7, comprising a specimen holder 17 and associated stage/actuator 19 for holding/positioning a specimen S. The vacuum chamber 7 (and also column 5/source 3) is evacuated using vacuum pumps (not depicted). With the aid of voltage source 21, the specimen holder 17, or at least the specimen S, may, if desired, be biased (floated) to an electrical potential with respect to ground.

By scanning the electron beam B over the specimen S, output radiation—comprising, for example, X-rays, infrared/visible/ultraviolet light, secondary electrons and/or backscattered electrons—emanates from the specimen S. Detectors 23, 27 can be chosen from a variety of possible detector types that can be used to examine different types/modalities of such output radiation.

Detector 23 is, for example, a segmented electron detector, comprising a plurality of independent detection segments (e.g. quadrants) disposed about a central opening 25 (encompassing the optical axis B'). Such a detector can, for example, be used to investigate the angular dependence of (secondary/backscattered) electrons emerging from the specimen S.

Detector 27 is, for example, an X-ray detector, which can be used to register X-rays emanating from the specimen S, and thus perform Energy-Dispersive X-ray Spectroscopy (EDX). It could alternatively be a cathodoluminescence detector, for example.

Alternatively or additionally, a backscattered electron detector may be included. Since the detected output radiation is position-dependent (due to said scanning motion and beamlet location), the information obtained from the detectors 23, 27 will also be position-dependent, and can thus be used to assemble an image that is basically a map of detector output as a function of scan-path position on the specimen S. The signals from the detectors 23, 27 pass along control lines (buses) 29', are processed by the controller 29, and displayed on display unit 31. Such processing may include operations such as combining, integrating, subtracting, false coloring, edge enhancing, and other processing known to the skilled artisan. In addition, automated recognition processes (e.g. as used for particle analysis) may be included in such processing.

In operation, electron beam Bo (see FIG. 2) generates a n×n array of beamlets B'' that are directed toward the sample S by column 5. As the array of beamlets B'' traverse the column 5, each beamlet propagates through the plurality of lenses 11, 13 and 14, for example, and stigmators 12 and 16. If stigmator 12 is arranged in or adjacent to a common beam crossover plane, then stigmator 12 will mainly correct astigmatism when excited. Additionally, if stigmator 16 is arranged downstream from an individual beam crossover plane, then stigmator 16 will mainly correct for first order distortion when excited. The location of stigmator 16 to an individual beam crossover plane and a common beam crossover plane may determine the amount of correction it can provide per unit of excitation. In general, locating stigmator 16 halfway between the two types of crossover planes may provide the most robust level of correction, since the halfway point results in Li equaling Lc that results in maximum distortion correction/effect. To ensure that the two stigmators 12, 16 substantially independently correct for astigmatism and linear distortion, they are arranged within column 5 so that an odd number of crossovers occurs between their positions. The odd number can be 1, 3, 5, etc. While examples with an odd number of crossovers occurring between the two stigmators may be preferable, examples with an even number of crossovers are possible and contemplated herein. The difference in the two types of examples may manifest in the excitation and control of the stigmators for addressing both astigmatism and linear distortion. Each beamlet, due to rastering of the beamlets B", will form a respective image of an area of sample S. Due to the two stigmators arranged according to the techniques disclosed herein, an amount of overscan of each beamlet may be reduced and microscope throughput increased.

Further, controller 29 includes code or receives code that allows microscope 100 to determine how to excite stigmators 12 and 16 so that both astigmatism and linear distortion are corrected. The code may go through a number of steps to arrive at the combination of excitations to apply to the two stigmators, which may be influenced by their relative locations within column 5. The method, described in more detail below with regards to FIG. 4, at least includes determining the astigmatic strength and anamorphic strength (e.g., the degree of linear distortion correction) of each of the two stigmators using at least three linearly independent excitations, such as with each off separately and both off simultaneously. To determine the astigmatic and/or anamorphic strengths, the beamlets are imaged to measure the location and/or astigmatism of each beamlet for each excitation setting. For example, an image of each beamlet may be acquired with both stigmators off, only the first stigmator on, and only the second stigmator on. By measuring the location of each beamlet for each setting, the anamorphic strength of each of the two stigmators per unit of excitation may be determined. For example, by measuring the relative movement of the beamlet for each setting, an amount of distortion per unit excitation is determined.

This determination results in obtaining the astigmatic and anamorphic strength per unit of excitation of each of the stigmators 12 and 16. Next, and based on the determined strengths with respect to astigmatism and linear distortion, astigmatism may be corrected using only the stigmator 12. Then, the linear distortion is measured. Subsequently, based on the measured linear distortion and the stigmator strengths, the excitation(s) of stigmator 16 (and possibly stigmators 12) can be determined so that linear distortion is corrected without changing the stigmatism. Exciting both stigmators 12 and 16 accordingly results in stigmatic and orthomorphic images.

In other examples, however, the process can be performed so that linear distortion is corrected first by exciting stigmator 16, for example, then a linear combination of excitations of stigmators 12 and 16 is determined that would correct the astigmatism while keeping the linear distortion constant. In yet another example, both stigmators 12, 16 may be excited with an arbitrary linear combination of energies, then one of the stigmators 12 or 16 may undergo additional excitation, plus or minus, to correct for any additional astigmatism and/or linear distortion introduced by the arbitrary linear combination of excitation energies.

In yet another example, if stigmators 12 is arranged to coincide with a common crossover plane, only determination of the anamorphic strength of stigmators 16 is required, then the stigmators 12 can be excited to correct for astigmatism while maintaining the excitation of stigmator 16 for correction of linear distortion.

Figure 2:
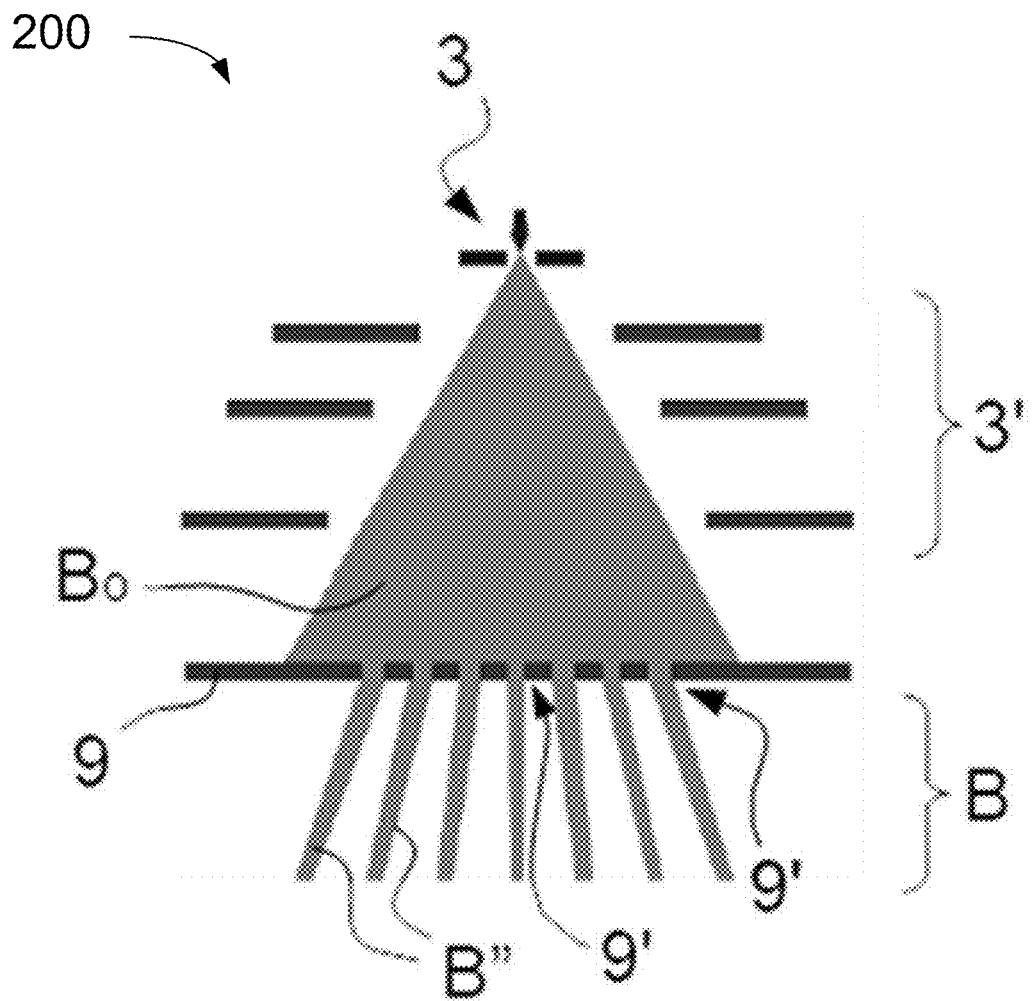
FIG. 2 is an illustration of a source generating multi-beam being generated using an aperture array plate in accordance with an embodiment of the present disclosure.

FIG. 2 is an illustration of a source 200 generating multi-beam being generated using an aperture array plate in accordance with an embodiment of the present disclosure. A precursor electron beam Bo leaves the electron emitter 3, traverses a series of electrodes 3', and impinges upon an aperture plate 9, which contains a plurality of apertures 9'. Such an aperture plate 9 can, for example, be manufactured by using thin film (MEMS) technology to etch an array of small apertures in a silicon sheet. The aperture plate/ALA 9 is located within electron beam column 5, for example, and will typically be disposed relatively close to the electron emitter 3, e.g., at a separation of the order of about 5-10 mm downstream thereof. As a result of impinging on the ALA 9, the precursor beam Bo is converted into a plurality/array B of sub-beams/beamlets/component beams B", in the same geometric configuration as the plurality of apertures 9" used to generate them. This beam array B then follows its course along axis B' through the column 5, which directs it onto a specimen S.

In some example, aperture plate/ALA 9 comprises an array of 14×14 apertures 9', each with a diameter of ca. 10 μm and at a pitch/separation of ca. 20 μm. In other example, aperture plate/ALA 9 comprises an array of 8×8 apertures 9'. The provided examples of the aperture plate 9 are non-limiting aspects to the present disclosure and any aperture plate design is contemplated herein.

The electrodes 3' create potential variations at each aperture 9', such that each aperture 9' acts as an electrostatic mini-lens. In this way, the various sub-beams B" are focused to an array of (intermediate) images of the source 3 downstream of the aperture plate/ALA 9. In general, only one electrode 3' may be needed to work in concert with the aperture plate/ALA 9 to produce this lensing effect; however, use of more than one electrode 3' gives more possibilities as regards tuning the beamlets.

The distance between the source 3 and the various apertures 9' (electrostatic mini-lenses) of the aperture plate/ALA 9 increases slightly with increasing distance from the optical/column axis B'. If all apertures/mini-lenses 9' had the same focal strength, this would cause variation in the image distances of the (intermediate) images of the source 3, such that these images would not lie in one common plane perpendicular to the optical/column axis B', but would instead lie on a curved surface (essentially part of a sphere). In order to prevent such curving of this plane with the (intermediate) source images, use can be made of a correctional electrode that is dimensioned such that its field predominantly affects the focal strengths of the outer mini-lenses. By appropriately tuning the electrical potential on this correctional electrode, the aforementioned curving can be mitigated/eliminated. Such a correctional electrode can be comprised in the illustrated group of electrodes 3', e.g. as set forth in the journal article by Y. Zhang and P. Kruit, "Design of a high brightness multi-electron-beam source", Proc. Seventh Int. Conf. on Charged Particle Optics, Physics Procedia 1 (2008), pp. 553-563, Elsevier pub. Alternatively, a correctional electrode of this type can be located downstream of the ALA 9, e.g. as set forth in U.S. Pat. No. 8,598,545 (incorporated herein by reference).

Figure 3:
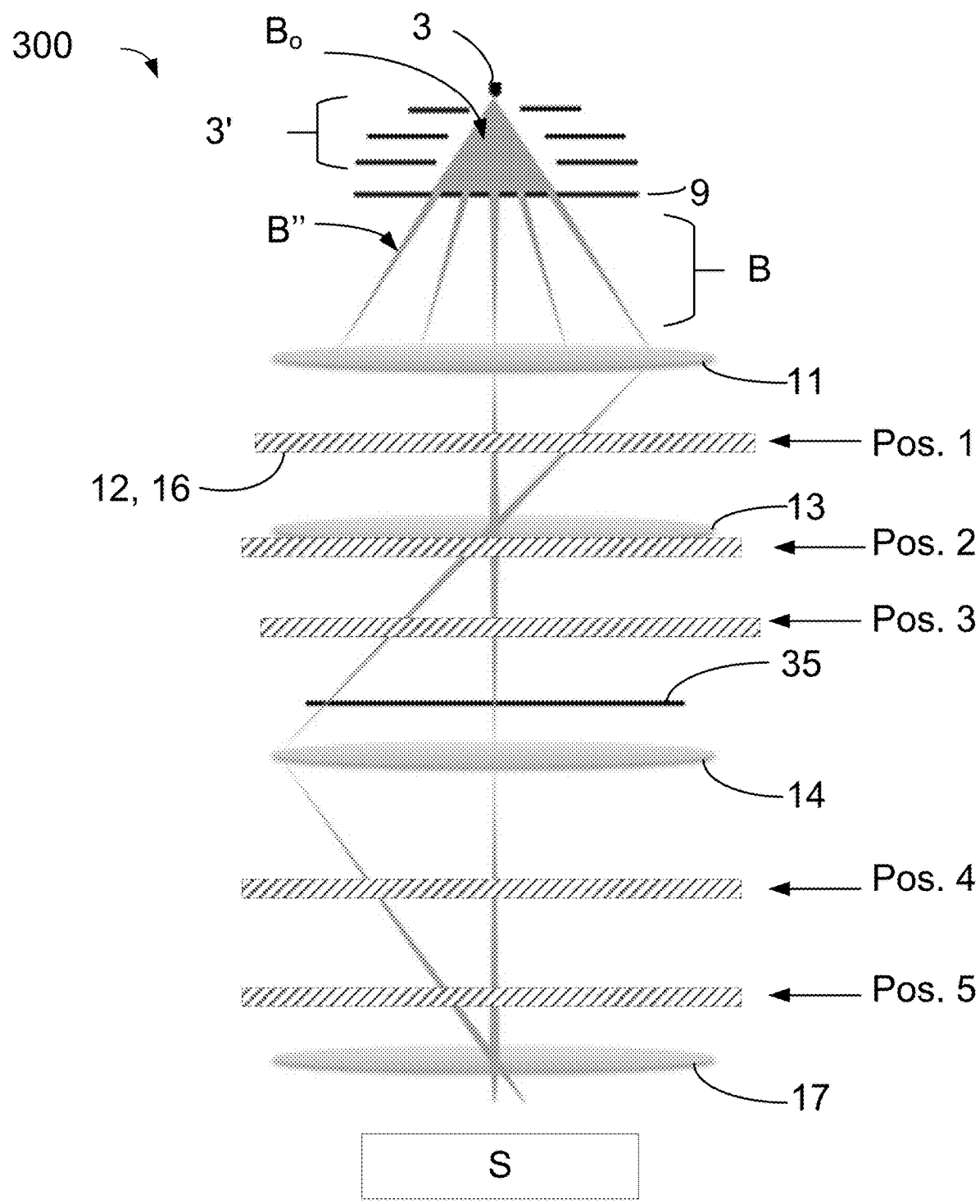
FIG. 3 is an illustration of a portion of an multi-beam electron microscope in accordance with an embodiment of the present disclosure.

FIG. 3 is an illustration of a portion of a multi-beam electron microscope 300 in accordance with an embodiment of the present disclosure. Microscope 300 is configured to provide a multi-beamlet electron beam B to a sample S that is corrected for both astigmatism and linear distortion due to at least two stigmators being included in system 300. By correcting, either reducing or eliminating, both astigmatism and linear distortion, over-scan requirements may be reduced, image quality improved and microscope throughput increased.

Microscope 300 includes a source and a column that combine to direct electron beam B toward the sample S. The source includes emitter 3, electrodes 3', and aperture array plate 9. These components were discussed above and such discussion will not be repeated for sake of brevity. The source generates electron beam Bo, which is the progenitor of beamlets B". The beamlets B" are directed toward the sample S via the column.

The column includes a plurality of lenses, such as lenses 11, 13, 14 and 17. While four lenses are shown, fewer or more lenses may be included without affecting the techniques disclosed herein and are within the contours of the disclosure. The lenses 11, 13, 14 and 17 are arranged along the column to direct and focus the beamlets B" toward and onto sample S. Such lenses can be either electromagnetic or electrostatic and each lens may be formed of one or more electrodes. Additionally, the column includes two stigmators 12 and 16, which are operated so that their combined influence on the beamlets corrects for both astigmatism and linear distortion. In general, the relative placement of each will not only determine what they mainly correct, but also their level of independent operation. There are combinations of locations, however, that may provide a reduction in their independence and which may allow for simpler operation.

Due to the various lenses, beam crossovers are formed at different locations within the lens. While this may not necessarily always be true, the column may be designed this way to reduce aberrations. The beam crossovers include common beam crossovers and individual beam crossovers. The common beam crossovers are locations where each beamlet crossovers over at the same location in the plane. Stated another way, the common crossover is where each beamlet crosses all other beamlets. The individual beam crossovers, on the other hand, are crossovers where each beamlet crosses over itself, but does not crossover with any other beamlet. For example, common beam crossover planes occur at the locations of lenses 13 and 17, whereas individual beam crossover planes occur at the locations of lenses 11 and 14.

For placement of stigmators 12 and 16, the locations may be selected to ensure that both astigmatism and linear distortion are corrected. In general, one stigmator may be located to substantially only correct astigmatism, while a combination of the two stigmators, in terms of excitation, corrects for linear distortion. For example, one stigmator may be arranged coincidence with or adjacent to lens 13, i.e., at Pos. 2. In some embodiments, lens 13 may be a condenser lens. Since this lens is also the location of a common beam crossover, then this stigmator may mainly correct for astigmatism. The other stigmator may then be located Pos. 4, which is halfway between lens 14 and lens 17, e.g., downstream from an individual crossover plane and halfway to the next common crossover plane. In some embodiments, lens 17 may be an objective lens. The stigmator at Pos. 4 may mainly correct for linear distortion but will also provide some stigmatic strength as well. While this combination of locations, e.g., Positions 2 and 4, provides for correction of astigmatism and linear distortion, other combinations of positions 1 through 5 are also possible and within the bounds of the present disclosure. Other example combinations include Positions 1 and 2, 2 and 3, 3 and 4, 1 and 4, 4 and 5, and etc. Alternatively, the two stigmators may be positioned some distance apart around position 1 or position 4, to provide some examples.

In some examples, it may be advantageous to position the stigmators such that an odd number of crossovers, counting both common and individual crossovers, occur between their locations, such as 1, 3, 5, and so on. However, the disclosed techniques work with an odd number of intervening crossovers as well, including zero, 2, 4, and so on.

Figure 4:
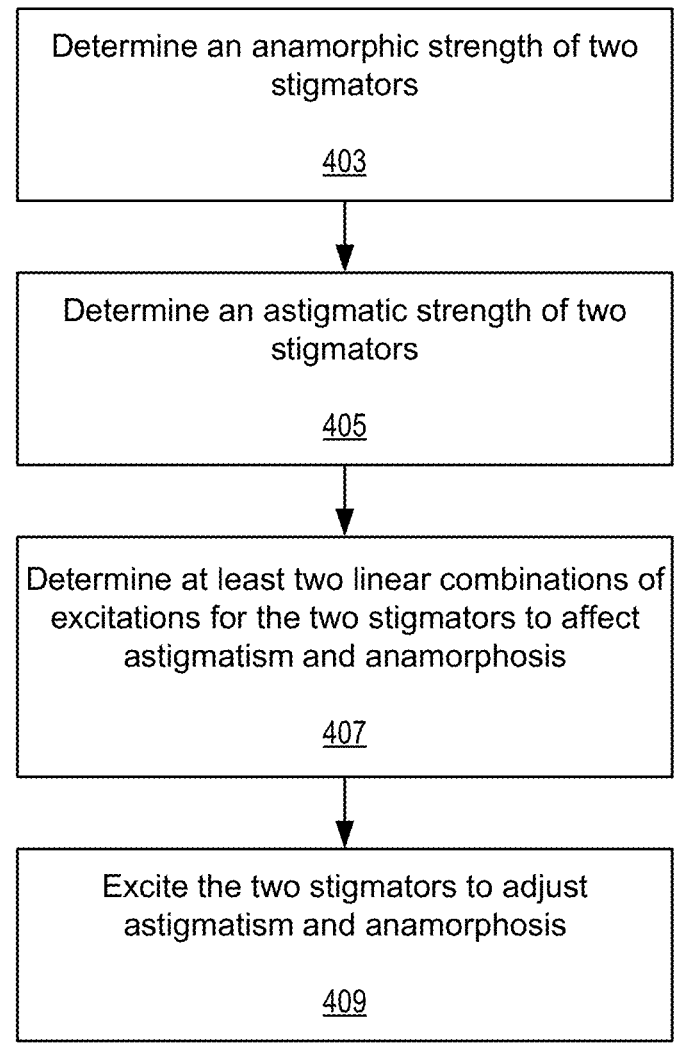
FIG. 4 is an example method for exciting two stigmators to correct for both astigmatism and linear distortion in accordance with an embodiment of the present disclosure.

FIG. 4 is an example method 401 for exciting two stigmators to correct for both astigmatism and linear distortion in accordance with an embodiment of the present disclosure. The method 401 may be implemented on an electron microscope that includes two stigmators, such as discussed with regards to microscope 100. In such an example, the two stigmators may be arranged as discussed herein so that they substantially function independent of one another. However, while one stigmator may only affect astigmatism, the other may influence both astigmatism and linear distortion. As such, the method of establishing an excitation for both stigmators includes determining an excitation level for each stigmator so that the overall affect is the reduction or elimination of both astigmatism and linear distortion for each beamlet of the MB-SEM. It should be noted that the level of excitation for each stigmator so that both astigmatism and linear distortion are corrected can be affected by their relative locations to common and beamlet crossover planes.

The method 401 may begin at process block 403, which includes determining an anamorphic strength of two stigmators. The two stigmators, for example, may be stigmators 12 and 16, as discussed above. The anamorphic strength, e.g., the degree of linear distortion correction per unit of excitation, of each of the two stigmators may be determined using at least three linearly independent stigmators settings and measuring the location of each beamlet for each setting. For example, an image of each beamlet may be acquired with both stigmators off, only the first stigmator on, and only the second stigmator on. By measuring the location of each beamlet for each setting, the anamorphic strength of each of the two stigmators per unit of excitation may be determined. For example, by measuring the relative movement of the beamlet for each setting, an amount of distortion per unit excitation is determined.

Process block 403 may be followed by process block 405, which includes determining the astigmatic strength of the two stigmators. As with process block 403, the two stigmators may be stigmators 12 and 16, for example. Determination of the astigmatic strength can be based on the anamorphic strength and knowing either the whole multi-beam trajectory, including common crossover and beamlet crossover positions, or the multi-beam trajectory between the two stigmators. Knowing the trajectory of the system or at least between the stigmators, a ratio between the anamorphic strength and the astigmatic strength can be determined, which leads to the determination of the astigmatic strength. In some examples, one stigmators may be located at a common crossover plane, which may negate the need to determine the astigmatic strength of that stigmators. In such an example, only the determination of the anamorphic strength of the other stigmators may be required.

In some examples, the astigmatic and/or anamorphic strengths may be determined using a camera to image the beamlets. The imaging may provide indication of the astigmatic and/or anamorphic strength based on the location of the individual probes and the relative skew and/or focus of the individual images or the composite image. Using a camera to determine the strengths may allow for rapid and periodic determinations of these values. If should be noted, however, that the anamorphic and astigmatic strength of a stigmator is a fixed value for each stigmator and the given beam trajectories and may only need to be measured once.

It should also be noted that process blocks 403 and 405 may be performed in the reverse order and that process block 403 does not need to be performed prior to process block 405.

Process block 405 or 403, may be followed by process block 407, which includes determining at least two linear combinations of excitations for the two stigmators to affect both astigmatism and linear distortion. The two linear combinations may result in one that combination only changes astigmatism, while keeping linear distortion constant. The other combination only change linear distortion, while keeping astigmatism constant.

Process block 407 may be followed by process block 409, which includes exciting the two stigmators to correct astigmatism and linear distortion. In one example, this process can include first eliminating the astigmatism in an image using conventional methods. Once the astigmatism is corrected, the location of the probes are measured to determine the linear distortion. Based on the determined linear distortion, one of the combinations of the excitations of the two stigmators is applied to remove the linear distortion while maintaining stigmation.

Figure 5:
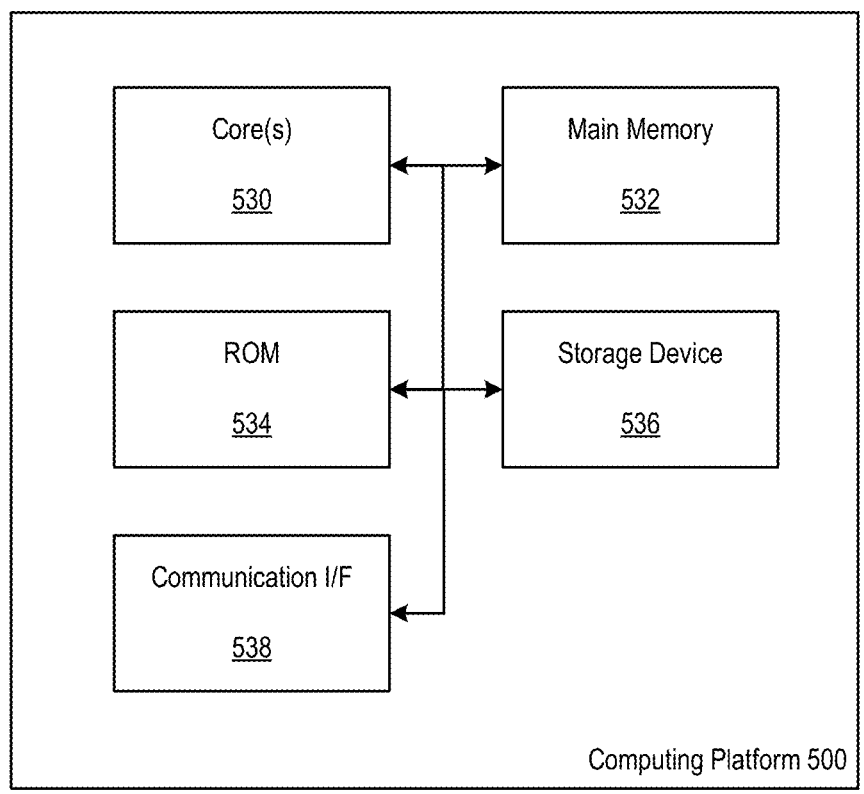
FIG. 5 is an example functional block diagram in accordance with an embodiment of the present disclosure.

FIG. 5 is an example functional block diagram 500 in accordance with an embodiment of the present disclosure. FIG. 5 is a block diagram that illustrates a computer system 500 that can be used to implement an embodiment of the present disclosure. The computing system 500 may be an example of computing hardware included with system 100 and/or EM 200, such controller 30/230, and which may incorporate memory 32 and be coupled to display 31 and user input device 33, for example. Computer system 500 at least includes a hardware processor, such as core(s) 530 for processing information, which may be coupled to a communication bus. The computing system 500 may be used to implement the methods and techniques disclosed herein, such as method 301, and may also be used to obtain images based on the synchronization of the scanning of the sample with the pulse period of a pulsed electron beam.

Computer system 500 also includes a main memory 532, such as a random access memory (RAM) or other dynamic storage device, coupled to a bus for storing information and instructions to be executed by core(s) 530. Main memory 532 also may be used for storing temporary variables or other intermediate information during execution of instructions to be executed by core 530. Such instructions, when stored in non-transitory storage media accessible to core 530, render computer system 500 into a special-purpose machine that is customized to perform the operations specified in the instructions. Main memory 532 may be memory 32 or separate from memory 32.

Computer system 500 further includes a read only memory (ROM) 534 or other static storage device coupled to the bus for storing static information and instructions for core 530. A storage device 536, such as a magnetic disk or optical disk, is provided and coupled to the bus for storing information and instructions.

Computer system 500 may be coupled via the bus to a display, such as display 31, for displaying information to a computer user. An input device 33, including alphanumeric and other keys, is coupled to the bus for communicating information and command selections to core 530. Another type of user input device is cursor control, such as a mouse, a trackball, or cursor direction keys for communicating direction information and command selections to core 530 and for controlling cursor movement on the display. This input device typically has two degrees of freedom in two axes, a first axis (e.g., x) and a second axis (e.g., y), that allows the device to specify positions in a plane.

Computer system 500 may implement the techniques described herein using customized hard-wired logic, one or more ASICs or FPGAs, firmware and/or program logic which in combination with the computer system causes or programs computer system 500 to be a special-purpose machine. According to one embodiment, the techniques herein are performed by computer system 500 in response to core(s) 530 executing one or more sequences of one or more instructions contained in main memory 532. Such instructions may be read into main memory 532 from another storage medium, such as storage device 536. Execution of the sequences of instructions contained in main memory 532 causes core 530 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical or magnetic disks, such as storage device 536. Volatile media includes dynamic memory, such as main memory 532. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, content-addressable memory (CAM), and ternary content-addressable memory (TCAM).

Storage media is distinct from but may be used in conjunction with transmission media. Transmission media participates in transferring information between storage media. For example, transmission media includes coaxial cables, copper wire and fiber optics, including the wires that comprise bus 640. Transmission media can also take the form of acoustic or light waves, such as those generated during radio-wave and infra-red data communications.

Various forms of media may be involved in carrying one or more sequences of one or more instructions to core 530 for execution. For example, the instructions may initially be carried on a magnetic disk or solid state drive of a remote computer. The remote computer can load the instructions into its dynamic memory and send the instructions over a network.

Computer system 500 also includes a communication interface 538 coupled to the bus. Communication interface 538 provides a two-way data communication coupling to a network link (not shown) that is connected to a local network. For example, communication interface 538 may be an integrated services digital network (ISDN) card, cable modem, satellite modem, or a modem to provide a data communication connection to a corresponding type of telephone line. As another example, communication interface 538 may be a local area network (LAN) card to provide a data communication connection to a compatible LAN. Wireless links may also be implemented. In any such implementation, communication interface 538 sends and receives electrical, electromagnetic or optical signals that carry digital data streams representing various types of information.

Computer system 500 can send messages and receive data, including program code, through network(s), a network link and communication interface 538. In the Internet example, a server might transmit a requested code for an application program through the Internet via an ISP, local network and/or communication interface 538. The received code may be executed by core 530 as it is received, and/or stored in storage device 536, or other non-volatile storage for later execution.

The embodiments discussed herein to illustrate the disclosed techniques should not be considered limiting and only provide examples of implementation. For example, multiple stigmators may be used to correct for both astigmatism and linear distortion instead of just the two discussed. The different numbers of members of stigmators may be placed along the column in the discussed locations and operated similarly, for example with only minor changes to their excitation energies. Those skilled in the art will understand the other myriad ways of how the disclosed techniques may be implemented, which are contemplated herein and are within the bounds of the disclosure.

One example multi-beam scanning electron microscope (MB-SEM) for correcting both astigmatism and linear distortion at least includes an electron source coupled to provide an electron beam, an aperture plate comprising an array of apertures, the aperture plate arranged to form an array of electron beamlets from the electron beam, and an electron column including a plurality of lenses and first and second stigmators, the electron column coupled to direct the array of electron beamlets toward a sample, wherein the first and second stigmators are arranged and excited to correct both astigmatism and linear distortion.

The above example where the first stigmator is arranged at a common beam crossover plane.

The above examples where the first stigmator is arranged in a plane with a condenser lens.

The above examples where the first stigmator corrects for astigmatism.

The above examples where the second stigmator is arranged between an individual beam crossover plane and a common crossover plane.

The above examples where the second stigmator is arranged between an objective lens and a lens between the objective lens and a condenser lens.

The above examples where the first stigmator is arranged between the second stigmator and the objective lens.

The above examples where the second stigmator substantially corrects for linear distortion.

The above examples where both the first and second stigmators are octupoles.

The above examples where the first stigmator corrects for astigmatism and the first and second stigmators combined corrects for linear distortion.

The above examples where the first stigmator is arranged in a plane with a condenser lens, and the second stigmators is arranged between an objective lens and a lens between the condenser lens and the objective lens.

Another example multi-beam scanning electron microscope (MB-SEM) for correcting both astigmatism and linear distortion at least includes an electron source coupled to provide an electron beam, an aperture plate comprising an array of apertures, the aperture plate arranged to form an array of electron beamlets from the electron beam, a plurality of lenses, first and second stigmators, and an electron column including the plurality of lenses and the first and second stigmators. The electron column coupled to direct the array of electron beamlets toward a sample, wherein the column, due to the plurality of lenses, forms at least one individual beam crossover plane in which each of said electron beams forms an intermediate image of said electron source, and at least one single common beam crossover plane in which the electron beams in the array cross each other, where an odd number of crossover planes, counting both individual and common beam crossover planes, are between the first and second stigmators.

The above example where the first stigmator is arranged at a common beam crossover plane or in a plane with a condenser lens or adjacent to a common beam crossover plane or in a plane with a condenser lens.

The above examples where the first stigmator corrects for astigmatism.

The above examples where the second stigmator is arranged between an individual beam crossover plane and a common crossover plane, or between an objective lens and a lens between the objective lens and a condenser lens.

The above examples where the first and second stigmators combined correct for linear distortion.

The above examples where the first stigmator corrects for astigmatism and the first and second stigmators combined corrects for linear distortion.

The above examples where the first stigmators is arranged in a plane with a condenser lens, and the second stigmators is arranged between an objective lens and a lens between the condenser lens and the objective lens.

The above examples where the plurality of lenses at least includes a gun les, a condenser lens, an intermediate lens, and an objective lens.

The above examples where the plurality of lenses are arranged in the order listed from the electron source to the sample.

The above examples where the aperture plate includes an n×n array of apertures.

And yet another example multi-beam scanning electron microscope (MB-SEM) for correcting both astigmatism and linear distortion at least includes a source coupled to provide an electron beam, an aperture array plate arranged to provide a plurality of probe beams from the electron beam, first and second stigmators, and a controller coupled to at least control an excitation of the first and second stigmators. The controller including code that, when executed by the controller, causes the controller to determine an anamorphic strength of two stigmators, determine an astigmatic strength of the two stigmators, based on the anamorphic and astigmatic strengths, determine at least two linear combinations of excitations for the two stigmators to affect astigmatism and linear distortion, and excite the first and second stigmators, based on the two linear combinations, to adjust astigmatism and linear distortion.

An example method for exciting a plurality of stigmators for correcting astigmatism and first order distortion in a multi-beam scanning electron microscope at least includes determining an anamorphic strength of two stigmators, determining an astigmatic strength of the two stigmators, based on the anamorphic and astigmatic strengths of the two stigmators, determining at least two linear combinations of excitations for the two stigmators to affect astigmatism and linear distortion, and exciting the two stigmators, based on the two linear combinations, to adjust astigmatism and linear distortion.

The example method of above where to determine an anamorphic strength of two stigmators includes determining probe beam position for each probe beam of a plurality of probe beams for a plurality of different stigmator settings.

The example methods of above where the plurality of different stigmator settings for the two stigmators includes both stigmators off, a first stigmator on with a second stigmator off, and the second stigmator on with the first stigmator off.

The example methods of above where determining probe beam position for each probe beam of a plurality of probe beams for a plurality of different stigmator settings includes imaging each probe beam position.

The example methods of above where the anamorphic strength is an amount of linear distortion caused by each of the two stigmators per unit of excitation.

The example methods of above where determining an astigmatic strength of the two stigmators includes based on a multi-beam trajectory occurring between the first and second stigmators, determining a ratio between the anamorphic and astigmatic strength of the two stigmators.

The example methods of above where the astigmatic strength is determined based on the ratio and the determined anamorphic strength.

The example methods of above where one combination of the two linear combinations only changes linear distortion but keeps astigmatism constant, and another combination of the two linear combinations only changes astigmatism but keeps linear distortion constant.

The example methods of above where exciting the two stigmators, based on the two linear combinations, to adjust astigmatism and linear distortion includes based on the two linear combinations, eliminating astigmatism with a combination of excitations of the two stigmators, measuring each probe beam position of the plurality of probe beams, based on the probe beam positions, determining an amount of linear distortion, and based on the two linear combinations, eliminating the determined linear distortion while continuing to eliminate the astigmatism.

The example methods of above where based on the two linear combinations, eliminating the determined linear distortion while continuing to eliminate the astigmatism includes adjusting the excitation of at least one of the two stigmators to remove the determined linear distortion while maintaining stigmation.

Another example of a multi-beam scanning electron microscope (MB-SEM) at least includes a source coupled to provide an electron beam, an aperture array plate arranged to provide a plurality of probe beams from the electron beam, first and second stigmators, and a controller coupled to at least control an excitation of the first and second stigmators. The controller including code that, when executed by the controller, causes the controller to determine an anamorphic strength of two stigmators, determine an astigmatic strength of the two stigmators, based on the anamorphic and astigmatic strengths, determine at least two linear combinations of excitations for the two stigmators to affect astigmatism and linear distortion, and excite the first and second stigmators, based on the two linear combinations, to adjust astigmatism and linear distortion.

The MB-SEM examples of above where the code to determine an anamorphic strength of two stigmators includes code that, when executed by the controller, causes the controller to determine a probe beam position for each probe beam of a plurality of probe beams for a plurality of different stigmator settings.

The MB-SEM examples of above where the plurality of different stigmator settings for the two stigmators includes both stigmators off, the first stigmator on with the second stigmator off, and the second stigmator on with the first stigmator off.

The MB-SEM examples of above where each probe beam position is determined using a camera.

The MB-SEM examples of above where the anamorphic strength is an amount of linear distortion caused by the two stigmators per unit of excitation.

The MB-SEM examples of above where the code to determine an astigmatic strength of the two stigmators includes code that, when executed by the controller, causes the controller to based on a complete multi-beam trajectory, including both common and individual crossover planes, of an electron column, determine a ratio between the anamorphic and astigmatic strength of the two stigmators.

The MB-SEM examples of above where the astigmatic strength is determined based on the ratio and the determined anamorphic strength.

The MB-SEM examples of above where one combination of the two linear combinations only changes linear distortion but keeps astigmatism constant, and another combination of the two linear combinations only changes astigmatism but keeps linear distortion constant.

The MB-SEM examples of above where the code to excite the first and second stigmators, based on the two linear combinations, to adjust astigmatism and linear distortion includes code that, when executed by the controller, causes the controller to based on the two linear combinations, eliminate astigmatism with a combination of excitations of the two stigmators, measure each probe beam position of the plurality of probe beams, based on the probe beam positions, determine an linear distortion, and based on the two linear combinations, eliminate the determined linear distortion while continuing to eliminate the astigmatism.

The MB-SEM examples of above where the code to eliminate the determined linear distortion while continuing to eliminate the astigmatism includes code that, when executed by the controller, causes the controller to adjust the excitation of at least one of the two stigmators to remove the determined linear distortion while maintaining stigmation.

What is claimed is:

1. An apparatus comprising:
   an electron source coupled to provide an electron beam;
   an aperture plate comprising an array of apertures, the aperture plate arranged to form an array of electron beamlets from the electron beam;
   an electron column including a plurality of lenses and first and second stigmators, the electron column coupled to direct the array of electron beamlets toward a sample, wherein the first and second stigmators are arranged and excited to correct both astigmatism and linear distortion,
   wherein the first stigmator is arranged at a common beam crossover plane.

2. The apparatus of claim 1, wherein the first stigmator is arranged in a plane with a condenser lens.

3. The apparatus of claim 1, wherein the first stigmator corrects for astigmatism.

4. The apparatus of claim 1, wherein the second stigmator is arranged between an individual beam crossover plane and a common crossover plane.

5. The apparatus of claim 4, wherein the second stigmator is arranged between an objective lens and a lens between the objective lens and a condenser lens.

6. The apparatus of claim 5, wherein the first stigmator is arranged between the second stigmator and the objective lens.

7. The apparatus of claim 4, wherein the second stigmator substantially corrects for linear distortion.

8. The apparatus of claim 1, wherein the first stigmator corrects for astigmatism and the first and second stigmators combined corrects for linear distortion.

9. An apparatus comprising:
- an electron source coupled to provide an electron beam;
- an aperture plate comprising an array of apertures, the aperture plate arranged to form an array of electron beamlets from the electron beam;
- a plurality of lenses;
- first and second stigmators; and
- an electron column including the plurality of lenses and the first and second stigmators, the electron column coupled to direct the array of electron beamlets toward a sample, wherein the column, due to the plurality of lenses, forms:
  - at least one individual beam crossover plane in which each of said electron beamlets forms an intermediate image of said electron source, and
  - at least one single beam crossover plane in which the electron beamlets in the array cross each other,
- wherein an odd number of crossover planes, counting both individual and common beam crossover planes, are between the first and second stigmators,
- wherein the first stigmator is arranged at a common beam crossover plane or in a plane with a condenser lens adjacent to a common beam crossover plane or in a plane with a condenser lens.

10. The apparatus of claim 9, wherein the first stigmator corrects for astigmatism.

11. The apparatus of claim 9, wherein the second stigmator is arranged between an individual beam crossover plane and a common crossover plane, or between an objective lens and a lens between the objective lens and a condenser lens.

12. The apparatus of claim 11, wherein the first and second stigmators combined correct for linear distortion.

13. The apparatus of claim 9, wherein the first stigmator corrects for astigmatism and the first and second stigmators combined corrects for linear distortion.

14. The apparatus of claim 9, wherein the plurality of lenses are arranged between the electron source and the sample.

* * * * *